United States Patent
Lee et al.

(10) Patent No.: US 9,091,491 B2
(45) Date of Patent: Jul. 28, 2015

(54) COOLING PLATES AND SEMICONDUCTOR APPARATUS THEREOF

(75) Inventors: Helder Lee, San Jose, CA (US); Miriam Schwartz, Los Gatos, CA (US); Michael Kuchar, Austin, TX (US); Aaron Webb, Austin, TX (US); Theodoss Costuros, Manchaca, TX (US)

(73) Assignee: Applied Materials, Inc., Santa Clara, CA (US)

( * ) Notice: Subject to any disclaimer, the term of this patent is extended or adjusted under 35 U.S.C. 154(b) by 1663 days.

(21) Appl. No.: 12/246,020

(22) Filed: Oct. 6, 2008

(65) Prior Publication Data
US 2009/0211742 A1    Aug. 27, 2009

Related U.S. Application Data

(60) Provisional application No. 61/030,908, filed on Feb. 22, 2008.

(51) Int. Cl.
| | |
|---|---|
| *C23C 16/50* | (2006.01) |
| *C23C 16/00* | (2006.01) |
| *C23F 1/00* | (2006.01) |
| *H01L 21/306* | (2006.01) |
| *F28F 3/12* | (2006.01) |
| *H01L 21/67* | (2006.01) |

(52) U.S. Cl.
CPC ............ *F28F 3/12* (2013.01); *H01L 21/67109* (2013.01)

(58) Field of Classification Search
USPC .................................. 118/715, 724, 728–732; 156/345.51–345.55
See application file for complete search history.

(56) References Cited

U.S. PATENT DOCUMENTS

| | | | | |
|---|---|---|---|---|
| 5,810,933 | A  * | 9/1998 | Mountsier et al. | 118/724 |
| 6,375,176 | B1 * | 4/2002 | Getchel et al. | 269/21 |
| 6,486,444 | B1 * | 11/2002 | Fairbairn et al. | 219/390 |
| 7,235,137 | B2 * | 6/2007 | Kitayama et al. | 118/724 |
| 2003/0186554 | A1 | 10/2003 | Tam et al. | |
| 2004/0040933 | A1* | 3/2004 | Kanno et al. | 216/67 |
| 2004/0238122 | A1* | 12/2004 | Ishizawa et al. | 156/345.31 |
| 2007/0157466 | A1* | 7/2007 | Kida et al. | 29/852 |

OTHER PUBLICATIONS

Lee, "Vantage 5.3 FI "SlimCool" Wafer Extended Abstract Cooldown System," Paper, *ET Conference 2008*—Extended Abstract.

* cited by examiner

*Primary Examiner* — Maureen Gramaglia
*Assistant Examiner* — Tiffany Nuckols
(74) *Attorney, Agent, or Firm* — Kilpatrick Townsend & Stockton LLP

(57) ABSTRACT

A cooling plate includes a channel to transmit a fluid, wherein the channel is disposed within a base and the channel has a first portion and a second portion. The first portion is disposed substantially along a peripheral edge of the base, and the second portion is coupled to the first portion and is disposed further away from the peripheral edge of the base than the first portion. The second portion has a length that is at least about 35% as long as the length of the first portion. The cooling plate also includes a lid disposed over the base and the channel, wherein the lid provides support for a substrate.

24 Claims, 8 Drawing Sheets

COOLING PLATES AND SEMICONDUCTOR APPARATUS THEREOF

CROSS-REFERENCES TO RELATED APPLICATIONS

The present application claims benefit under 35 USC 119 (e) of U.S. provisional Application No. 61/030,908, filed on Feb. 22, 2008, entitled "Slim Wafer Cool Down Station for the Vantage Quickstart 5.3 Factory Interface," the content of which is incorporated herein by reference in its entirety.

BACKGROUND

The application relates generally to semiconductor processing equipment and particularly to cooling plates located within the semiconductor processing equipment that has been outfitted to increase throughput without increasing its footprint.

Rapid Thermal Processing, commonly referred to as "RTP," subjects a wafer to a very brief, intense burst of heat that can go from room temperature to over 1,000° C. in seconds. This technology is used to change characteristics of deposited films or crystal lattices. With the short, fast-ramping temperature cycling of RTP, variations among systems can potentially have a large impact on process results, which in turn can affect device speed and reliability. The most common use of an RTP chamber is for annealing, which activates and controls the movement of atoms in the device after implanting. Other uses of RTP chambers include silicidation, which uses heat to form silicon-containing compounds with metals such as tungsten or titanium, and oxidation, which involves growing oxide on the wafer.

After RTP, heated substrates are cooled down and transferred into substrate carriers, such as cassettes, for subsequent processes. Substrates are cooled by placing them on cooling plates. Cooling plates absorb energy from the hot substrates causing the substrates to cool. The temperature of the cooling plate is maintained low by flowing a coolant through the cooling plate. The coolant absorbs the energy transferred from the substrate to the cooling plate and transfers that energy away from the cooling plate. The coolant is typically water which flows through the cooling plate and carries away the heat from the substrate to cool down the substrate. Conventionally, the cooling plate takes about 60 seconds to cool down the substrate to about 100° C.

Conventionally, two cooling plates are disposed at the center of an interface unit disposed between two load ports and two RTP chambers. The cooling plates are vertically aligned within the interface unit and separated by a distance, such that a robot can transfer substrates between the cooling plates. In an effort to increase throughput, a third load port can be added to the interface unit. Adding a third load port increases the number of substrates that can be provided to the RTP chamber and increases throughput. If a third load port is added, then the load ports are connected with the interface unit at the left side, center, and the right side of the interface unit. Placing conventional cooling plates in the center of the interface unit makes transferring the substrates into or from a substrate carrier, which is loaded on the central-disposed load port, difficult and less efficient because the conventional cooling plate located in the center of the interface unit interferes with the transfer of substrates. Placing cooling plates in the center of the interface unit, when there are three load ports present, causes additional problems such as constraints of the work place (e.g. lack of accessibility to Front Opening Unified Pod (FOUP)), lack of support bracket mounting features, robot accessibility and reach, among many others.

Although the use of three load ports increases the number of substrates that are loaded for processing, it also puts a strain on the system because additional wafers need to be cooled rapidly enough such that the cooling process does not slow down the system. Conventionally, cooling a wafer to around 100° C. on a cooling plate takes about 60 seconds. If three load ports are used, this long cooling time can affect the efficiency of the system because wafers may be processed faster throughout the system but cannot be cooled fast enough.

Therefore, what is needed is a cooling system and configuration of a thermal processing system that is efficient enough to process substrates supplied from three load ports located in the factory interface.

BRIEF SUMMARY

Embodiments of the invention relate to cooling plates and thermal processing apparatus having the cooling plates. The cooling plate, which is more compact than conventional cooling plates and cools thermally processed wafer efficiently, can include a channel having a first portion and a second portion. The first portion of the channel can be disposed substantially along the peripheral edge of the cooling plate. The second portion of the channel can be disposed within the cooling plate away from the peripheral edge of the cooling plate. The second portion of the channel has a length of about 35% or more of the length of the first portion of the channel. The increased length of the channel advantageously and efficiently removes the heat of the thermally processed substrate. A lid, which is disposed over the cooling plate base, can be used to support a substrate. Other embodiments of the invention include combinations of a decreased in material distance between the substrate and the cooling plate, an increased convective surface area, a decreased thermal mass, and/or placement of balls where heat is conducted away from the wafer. Embodiments of the invention incorporate various of these combinations to draw heat more efficiently away from the wafer, thus reducing the cooling time.

In yet another embodiment of the invention a thermal processing apparatus includes at least one thermal processing chamber that is used to thermally process a substrate and a cooling plate that is used to cool the substrate. The cooling plate can be incorporated into an interface unit that is connected with the at least one thermal processing chamber. The cooling plate includes a cooling plate base and a channel disposed within the cooling plate base. The channel, which can be used to transmit a cooling fluid, includes a first portion and a second portion. The first portion of the channel is disposed substantially along a peripheral edge of the cooling plate base. The second portion of the channel, which is connected with the first portion of the channel, has a length of about 35% or more of the length of the first portion of the channel. A lid, which is disposed over the cooling plate base, can be used to support a substrate.

BRIEF DESCRIPTION OF THE DRAWINGS

A further understanding of the nature and advantages of the invention may be realized by reference to the remaining portions of the specification and the drawings wherein like reference numerals are used throughout the several drawings to refer to similar components. In some instances, a sub label is associated with a reference numeral and follows a hyphen to denote one of multiple similar components. When reference is made to a reference numeral without specification to an existing sub label, it is intended to refer to all such multiple similar components. The Figures are incorporated into the detailed description portion of the invention.

DETAILED DESCRIPTION

Embodiments of the present invention include a wafer cooling plate having increased channel length for transmitting cooling fluid and increased coverage under the wafer. Embodiments of the present invention can also include decreased material distance between the wafer and the channel carrying the cooling fluid, increased convective surface area, decreased thermal mass, and a plurality of oxide balls positioned to conduct heat away from the wafer. Embodiments of the present invention can use various combinations of the above features, which contribute to drawing heat more efficiently away from the wafer, thus improving the cooling time.

Additional embodiments of the invention include a thermal processing apparratus that incorporates the wafer cooling plate. Use of the thinner wafer cooling plate permits the thermal processing apparatus to include more load ports than conventional thermal processing apparatuses within the same footprint because the thinner wafer cooling plate occupies less space but cools the wafers at least as efficiently as conventional cooling plates. Since additional load ports are included, the thermal processing apparatus has a higher throughput than conventional thermal processing apparatuses and therefore is more efficient.

Figure 1:
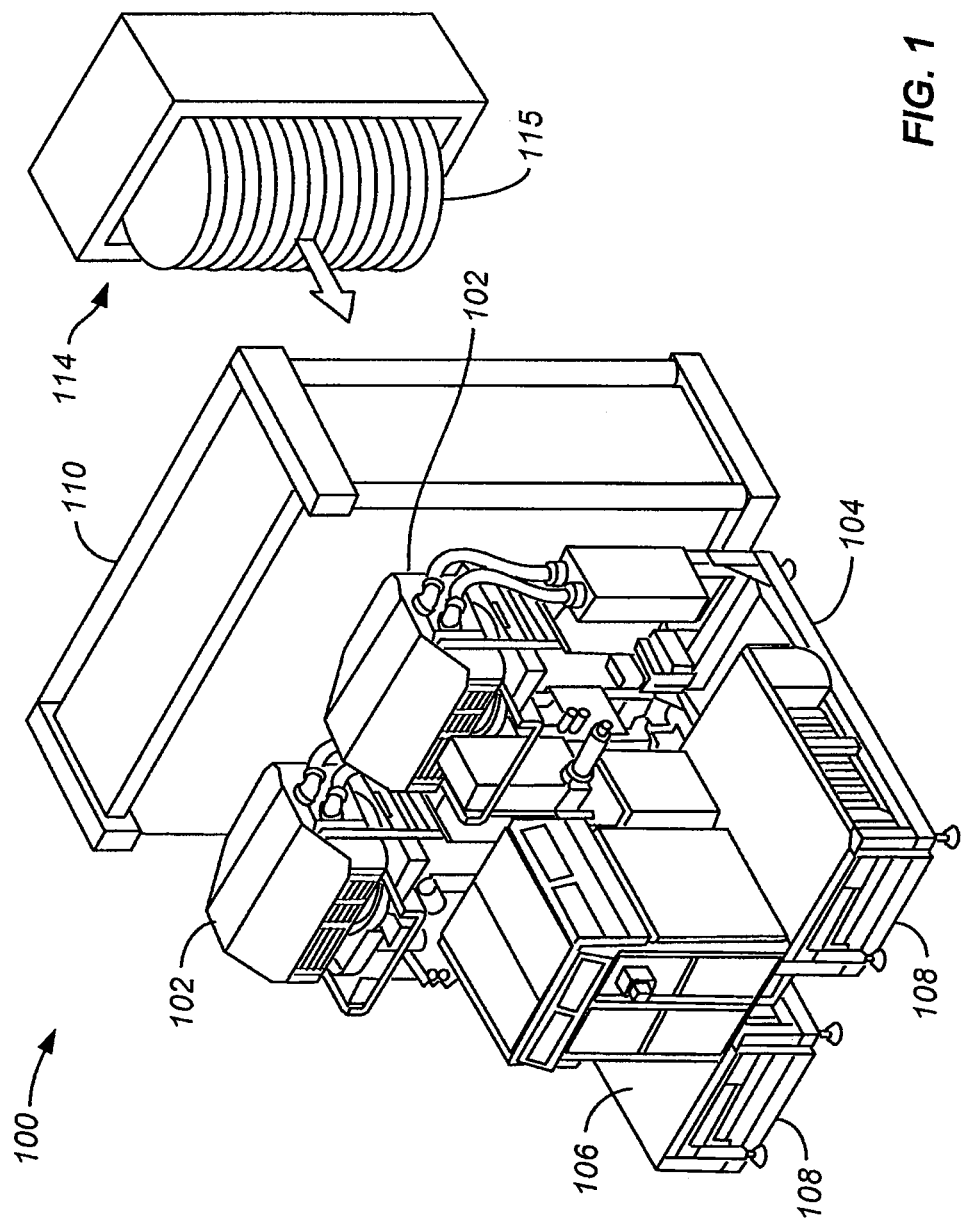
FIG. 1 is an illustration of an exemplary thermal processing apparatus incorporating an interface unit according to an embodiment of the invention.

FIG. 1 is an illustration of an exemplary thermal processing apparatus 100 including at least one single wafer processing chamber 102, frame 104, temperature controller 106, electronics controls 108, in-process factory interface unit 110, and cartridge 114. Thermal processing apparatus 100 can be, for example, a rapid thermal processing (RTP) apparatus and the single wafer processing chamber 102 can be a RTP single wafer processing chamber 102. The RTP single wafer processing chamber 102 can be placed on the common frame 104 to gain the benefit of a common location for temperature controllers 106, electronics controls 108, in-process factory interface unit 110, electrical wiring for lamps (not shown), ventilation systems (not shown), and piping from a gas panel (not shown). Interface unit 110 is adapted to receive cartridges 114 containing substrates 115. Cartridge 114 can contain both processed substrates and unprocessed but ready to be processed substrates. A robot (not shown) is used to transfer substrates 115 between the different chambers of the thermal processing apparatus 100. Wafer cartridge 114 can also be added and removed automatically from the factory interface unit 110. Factory interface unit 110 can be enclosed to provide a clean and pressure-controlled environment for robot movement and wafer handling. For example, the pressure within in-process factory interface unit 110 can be set substantially close to the fabrication environment pressure so that there is no substantial pressure gradient between the fabrication environment and the robot handling environment.

In one embodiment of the present invention, during operation, cartridge 114 is loaded into a load port (not shown), which is coupled to the in-process factory interface unit 110. The robot (not shown) of thermal processing apparatus 100 then removes substrate 115 from cartridge 114 and transfers substrate 115 into RTP single wafer processing chamber 102 through interface unit 110. RTP single wafer processing chamber 102 then thermally processes substrate 115 by rapidly heating the substrate to a predetermined temperature. In some embodiments the substrate is kept at the predetermined temperature for a dwell time whereas in other embodiments the substrate is allowed to cool as soon as the predetermined temperature is reached (i.e. there is no dwell time). The robot then removes thermally processed substrate 115 from the RTP processing chamber and transfers the substrate 115 to a cooling plate (not shown) for cooling down the thermally processed substrate 115. After the cooling process, the robot removes cooled substrate 115 from the cooling plate and transfers the cooled substrate 115 to cartridge 114.

The cooling process can often take a significant amount of time and can therefore significantly effect the throughput of thermal processing apparatus 100. The thermal processing apparatus 100 includes a cooling plate as is further described below in details with reference to FIGS. 3-5 that has a thin profile but still cools wafer sufficiently fast.

Figure 2A:
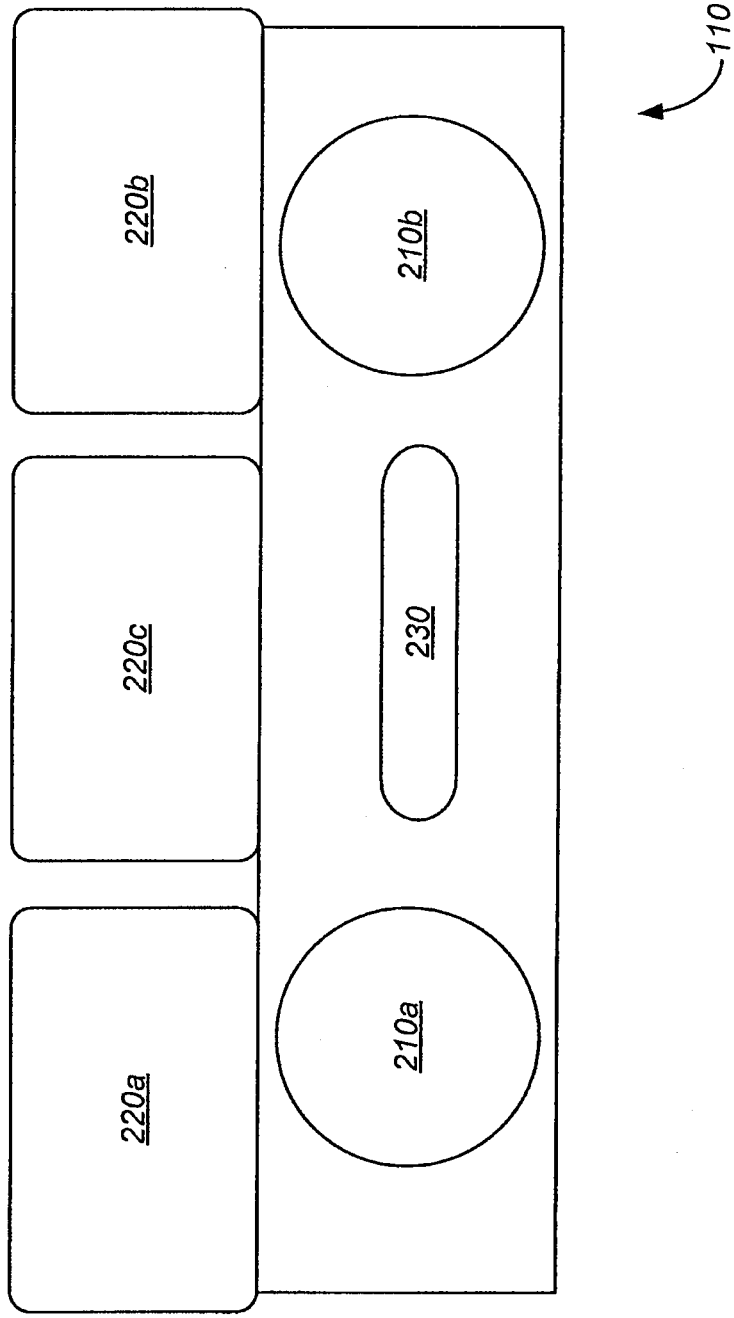
FIG. 2A is a simplified top view of an interface unit according to an embodiment of the invention.

FIG. 2A is a simplified top view of an interface unit 110 including a first cooling plate 210a, a second cooling plate 210b, a left load port 220a, a right load port 220b, a center load port 220c, and a robot 230, in accordance with one embodiment of the invention. The first cooling plate 210a, the second cooling plate 210b and the robot 230 are disposed within the in-process factory interface unit 110. The in-process factory interface unit 110 is coupled to load ports 220a-220c. The first cooling plate 210a can be located close to the left load port 220a whereas the second cooling plate 210b can be located close to the right load port 220b. Cooling plates 210a and 210b are located substantially on the same plane parallel to the ground (i.e. cooling plates 210a and 210b are level with the ground) so that both cooling plates 210a and 210b are horizontal with the ground. Robot 230 can be located in between the first cooling plate 210a and the second cooling plate 210b. Cooling plates 210a-210b are used to cool down thermally processed substrates transferred from processing chambers 102, as described in further detail with reference to FIGS. 3-5 below. Load ports 220a-220c are used to support substrate carriers that can carry processed and/or unprocessed substrates. Robot 230 is used to transfer substrates between processing chambers 102, cooling plates 210a-210b, and load ports 220a-220c.

During operation of the thermal processing unit 100, substrates are first loaded into the load ports 220a-220c. Robot 230 then picks up one of the substrates at a time and transfers the substrate into the wafer processing chamber 102, where it is processed according to a process recipe. Typically the processing includes rapidly heating the substrate to a high temperature. After the substrate is processed in the processing chamber 102, robot 230 picks up the substrate from processing chamber 102 and transfers the substrate to one of the cooling plates 210a-210b. The substrate is then cooled on the cooling plate for either a predetermined time or until the temperature of the substrate has reached a predetermined temperature. After the substrate has been cooled, robot 230 picks up the substrate and transfers it back into one of the load ports 220a-220c. Those skilled in the art will realize that this process is on-going so that at any one time there are multiple wafers being processed in processing chamber 102 and being cooled on cooling plates 210a-210b. Software running the apparatus commands robot 230 to transfer wafers between the processing chamber 102, load ports 220a-220c, and cooling plates 210a-210b so that the throughput of thermal processing unit 100 is optimized for different process recipes.

In order for the robot 230 to move freely and be able to access the various wafer processing chambers 102, cooling plates 210a-210b, and load ports 220a-220c in thermal processing unit 100, the cooling plates 210a-210b are constructed and positioned to give the robot 230 clearance to operate, as needed, while still providing sufficient cooling capacity. In one embodiment of the invention, the cooling plates 210a-210b are disposed over doors (not shown) connected with load ports 220a-220b, respectively, such that robot 230 can transfer substrates into or from substrates carriers loaded in load ports 220a-220b, free from interference. In this embodiment, the cooling plates are constructed to be thin enough to fit over the doors of load ports 220a-220b, as described in further detail with reference to FIGS. 3-5, below. Those skilled in the art will recognize that the numbers of cooling plates 210a-210b and load ports 220a-220c described in this embodiment of the invention are merely examples. Various numbers of cooling plates and load ports can be installed for thermal processing apparatus 100.

Figure 2B:
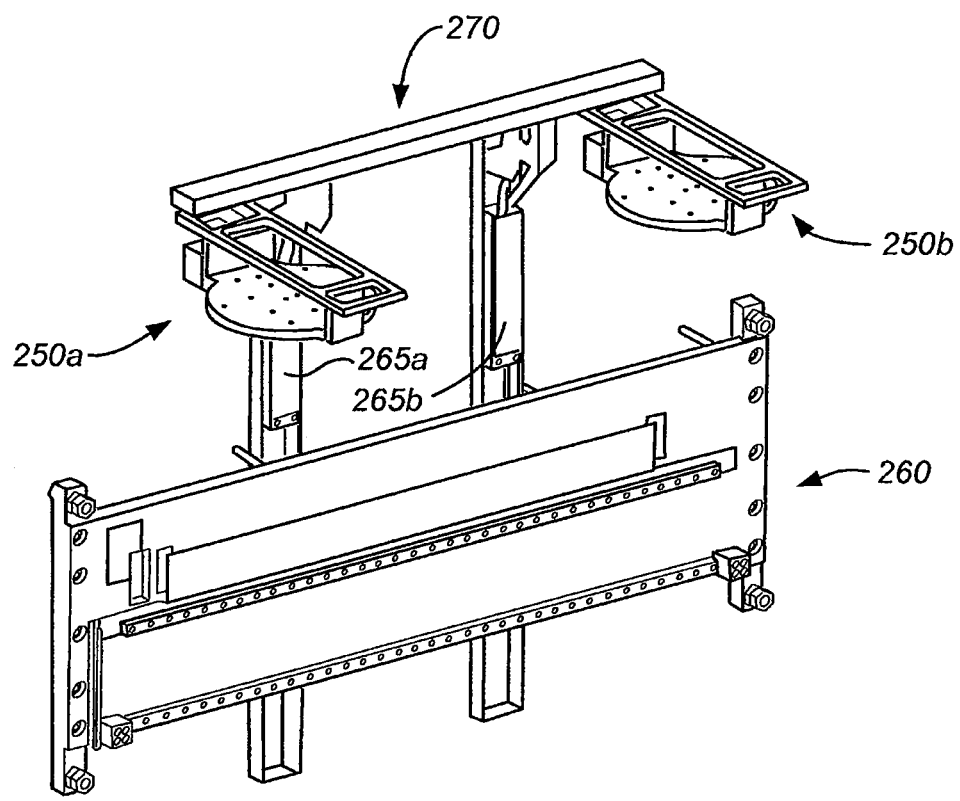
FIG. 2B is an illustration showing a perspective view of the interface unit 110 according to an embodiment of the invention.

FIG. 2B is an illustration showing a perspective view of the interface unit 110 including perspective views of the first cooling plate 250a, the second cooling plate 250b, the wafer transport mechanism (robot) 260, a first manifold 265a, a second manifold 265b, and a leveling and supporting structure 270, in accordance with one embodiment of the invention. Cooling plates 250a and 250b are supported by the leveling and supporting structure 270. The leveling and supporting structure 270 holds both cooling plates 250a and 250b substantially horizontal with the ground and substantially on the same plane parallel to the ground. The first manifold 265a and the second manifold 265b are each coupled to the channel described below with reference to FIGS. 3-5 and are used to deliver and remove cooling fluid to the cooling plates. The first manifold 265a and the second manifold 265b are located on the posts used to support the leveling and supporting structure 270, and away from the traveling path of the robot 260, which is used to load and unload substrates. In one embodiment the first manifold 265a is used to deliver cooling fluid to the both cooling plates 250a and 250b while the second manifold 265b is used to remove cooling fluid from both of the cooling plates 250a and 250b. Because the robot must travel between the load ports and both cooling plates 250a and 250b, both manifolds are constructed to be small enough to fit outside of the robot's 260 travel path.

Figure 3:
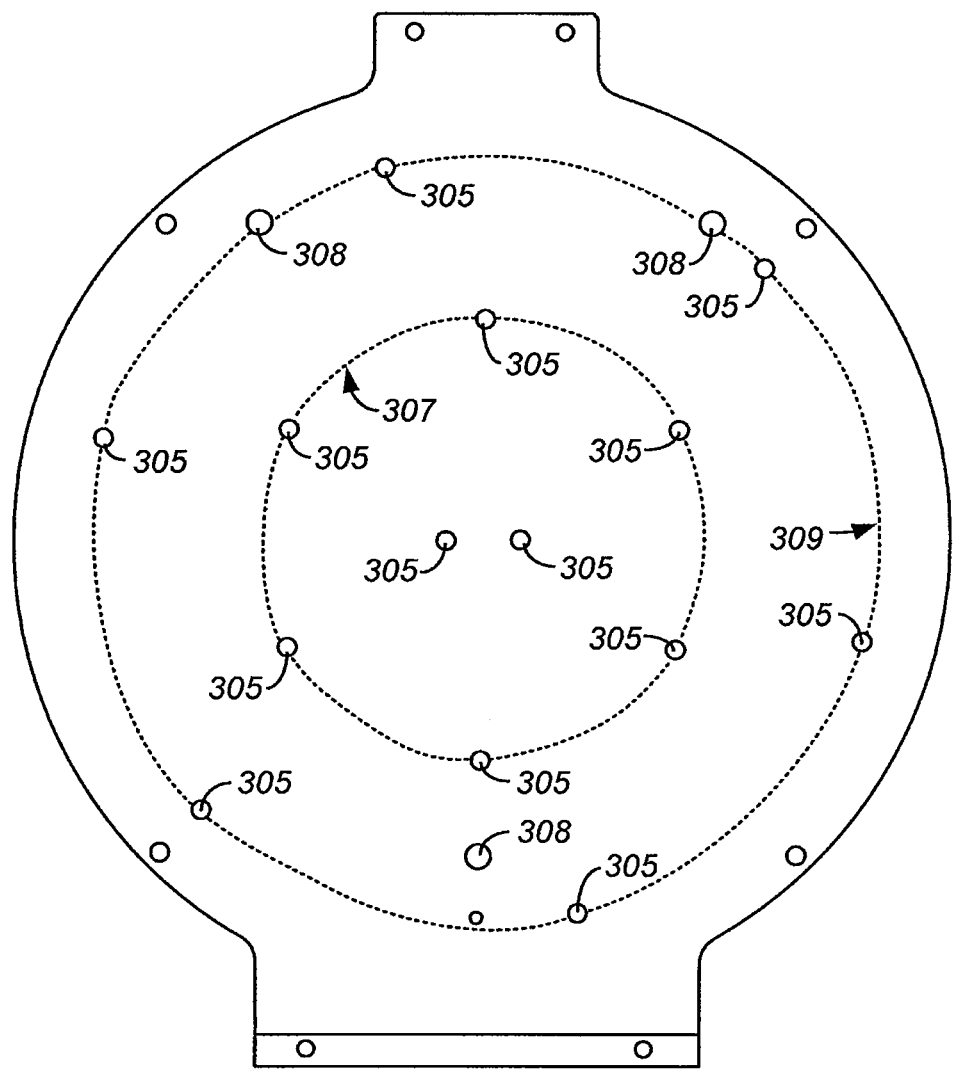
FIG. 3 is a simplified top view of a cooling plate according to an embodiment of the invention.

FIG. 3 is a simplified top view of one of the cooling plates 210a including a plurality of balls 305 and a plurality of pins 308, according to an embodiment of the present invention. In FIG. 3, cooling plate 210a is used to support and cool down a thermally processed substrate (not shown), e.g., 200-mm wafer, 300-mm wafer, or the like. Cooling plate 210a includes a plurality of balls 305 located on the surface of cooling plate 210. When the thermally processed substrate is placed on top of the balls 305 by the transfer robot, balls 305 support the processed substrate, such that the processed substrate is separated from the surface of cooling plate 210. Balls 305 can be used to desirably transmit the heat from the thermally processed substrate to cooling plate 210. Balls 305 can be, for example, ceramic balls, oxide balls, or other dielectric balls which are constructed to make physical contact with the substrate and release the heat of the substrate. Balls 305 can be evenly distributed on cooling plate 210. In embodiments, balls 305 can be arranged along circles 307, 309 around the center of cooling plate 210. The number of balls 305 can be about 13 or 14, for example. The shape of balls 305 can be spherical, rectangular, cylindrical, or the like. Balls 305 can be either removabaly connected or attached to the surface of the cooling plate. In one embodiment, balls 305 are placed in an indentation made on the surface of the cooling plate 210a and are held there by gravity, friction, or electrostatic forces. In another embodiment of the invention, balls 305 are forced into indentations located on the surface of the cooling plate 210a. In yet another embodiment, balls 305 are held on the surface of the cooling plate 210a with the use of an adhesive or other means for joining materials. Cooling plate 210 can also have pin holes 308 through which pins (not shown) can move up or down to lift or lower the substrate onto balls 305. It is noted that configurations of balls 305 and numbers of balls 305 and pin holes 308 can be modified to achieve a desired cooling rate of the substrate.

Figure 4A:
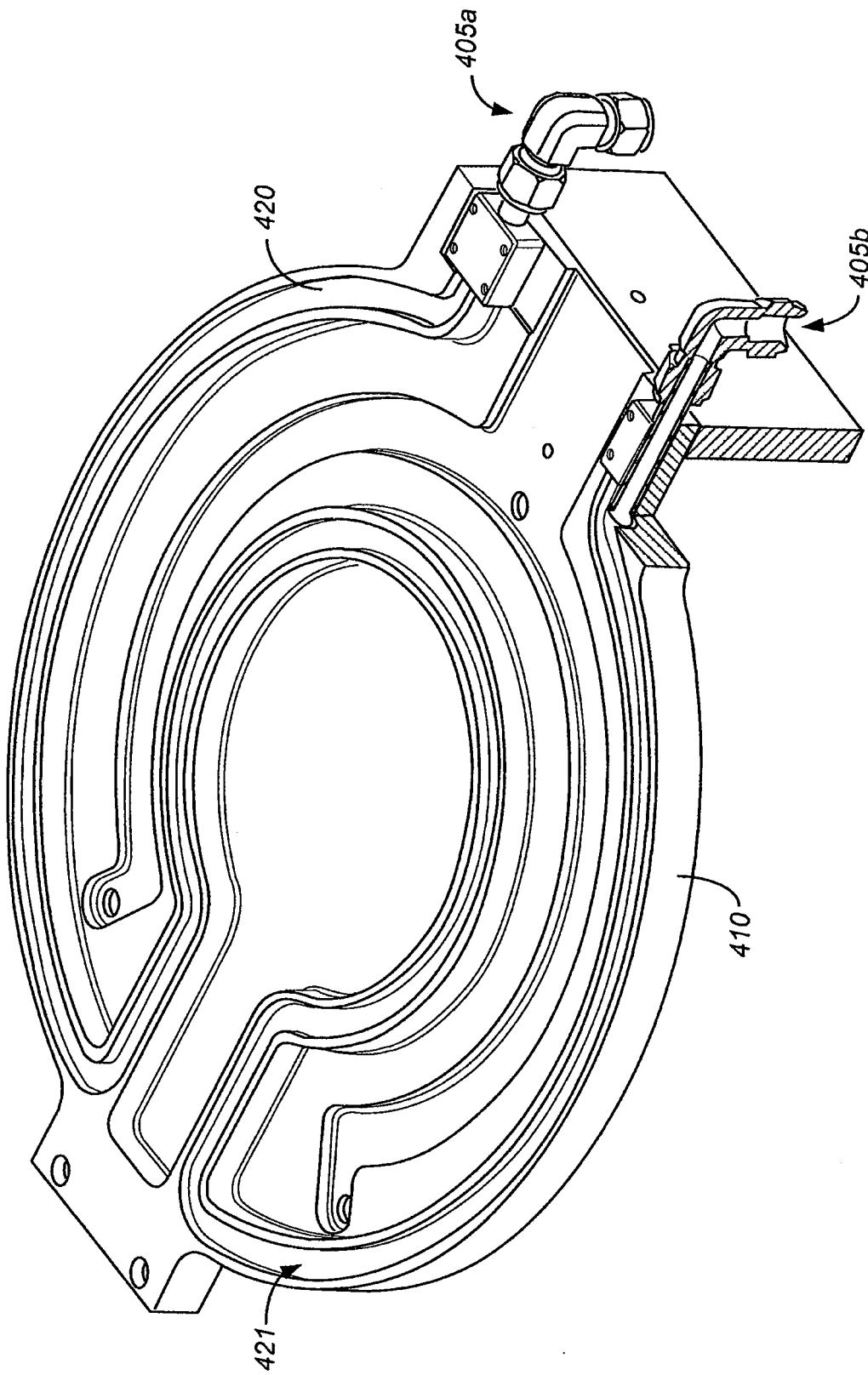
FIG. 4A is a perspective view showing a cooling plate base with a channel for transmitting a cooling fluid, according to an embodiment of the invention.
Figure 4B:
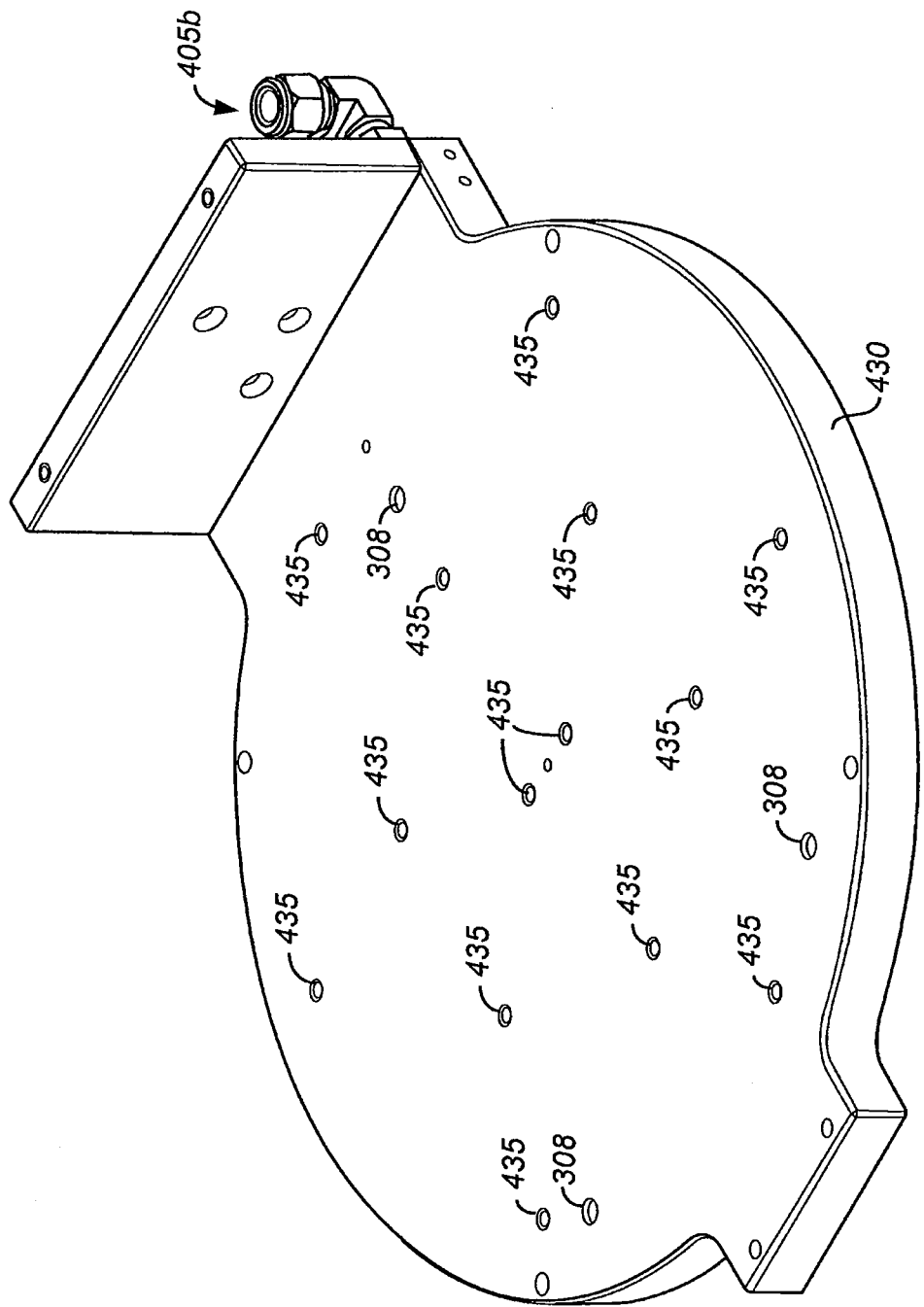
FIG. 4B is a perspective view showing a cooling plate lid that is disposed over the cooling plate base of FIG. 4A, according to an embodiment of the invention.

FIGS. 4A-4B are perspective views showing a channel within a base and a lid of a cooling plate according to an embodiment of the invention. The cooling plate is used to cool substrates after substrates have been processed and are hot because of the processing. For example, the cooling plate is used to cool substrates after undergoing rapid thermal processing. The substrate is cooled by being placed on top of the lid and flowing cooling fluid through the channel disposed within the base. Cooling plate 210a (shown in FIG. 3) includes base 410, channel 420, and lid 430. Cooling plate 210a can be coupled to cooling fluid inlet 405a and cooling fluid outlet 405b through which a cooling fluid is provided. Base 410 can have at least one groove 421 in which channel 420 can be disposed. Channel 420 can directly contact base 410, for example. Lid 430 can be disposed over base 410 to substantially seal channel 420 within base 410. Lid 430 can include a plurality of holes 435 for accommodating balls 305 (shown in FIG. 3) and pin holes 308.

In embodiments, base 410 and lid 430 can be made from, for example, ceramic, oxide, or other dielectric material that can stand the temperature of the thermally processed substrate. For example, in one embodiment, the base 410 and lid 430 can form a susceptor that is used to support a substrate or wafer. A susceptor is a platform that is used to support a substrate and is made of a heat-conducting body of graphite that is coated with silicon carbide (SiC). The base 410 and lid 430 can be made to be a susceptor by constructing them both out of SiC. The susceptor assists with cooling of the substrate because the heat-conducting body draws heat away from the substrate and into the channel 420 where the cooling fluid flowing in the channel absorbs the heat and transmits the heat out of the cooling plate. Alternatively, only the lid 430 can be made to act as a susceptor by making the lid 430 to be a solid SiC platform.

Channel 420 is used to carry the cooling fluid through the cooling plate which cools the plate and a substrate or wafer resting on top of the plate by carrying heat away. In one embodiment, the channel can be a tube or pipe that has been manufactured to fit within the base. In another embodiment, the channel can be a groove machined directly into the base. If the channel is a groove then the fluid flows directly in the channel.

Figure 5:
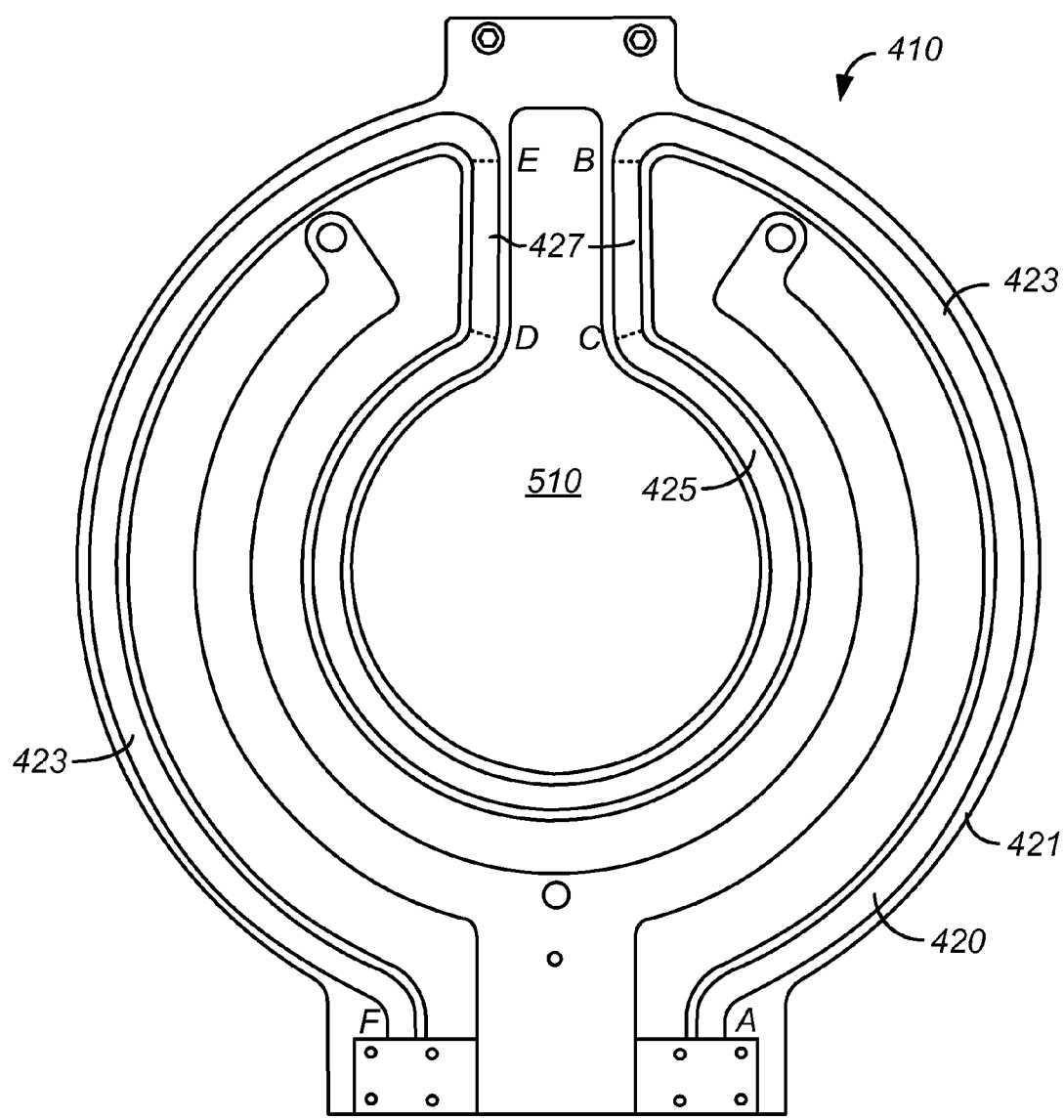
FIG. 5 is a bottom view of the cooling plate base of FIG. 4A, according to one embodiment of the invention.

FIG. 5 is a bottom view showing a channel disposed within a cooling plate base according to an embodiment of the invention. In FIG. 5, the cooling plate base 410 can include groove 421 substantially along the peripheral edge of cooling plate base 410. Groove 421 can be designed in response to the shape of channel 420 (shown in FIG. 4A). Cooling plate base 410 can include at least one opening 510, which is around the center of cooling plate base 410. Opening 510 can be any kind of shape if cooling plate base 410 can carry a desired thermal mass and/or opening 510 can provide a desired convection. Compared with a conventional cooling plate which does not have opening 510, cooling plate base 410 has a smaller volume and thus carry less thermal mass. In addition, if a thermally processed substrate is loaded on cooling plate 210 (shown in FIG. 3), the heat of the substrate can be desirably convected through opening 510. As described above with reference to FIG. 4, cooling plate base 410 can also be a susceptor that is made out of a heat-conducting body that is coated with SiC.

Referring to FIG. 5, channel 420 can include first portions 423 and second portion 425. Channel 420 can be a metallic tube in which a cooling fluid, such as cooling water or cooling gas, can flow. First portions 423 can be connected with second portion 425 through third portions 427. First portions 423 can be disposed along the peripheral edge of cooling plate base 410. Second portion 425 can be disposed along the circumferential edge of opening 510. In some embodiments, the length of second portion 425 is about 35% or more of the length of first portion 423, such that channel 420 can desirably release heat. For example, first portions 423 can have lengths from point "A" to point "B" and point "E" to point "F." Second portion 425 can have a length from point "C" to point "D." Third portions 427 can have lengths from point "B" to point "C" and point "D" to point "E." In one embodiment, the second portion 425 length from point "C" to point "D" is about 35% or more of the length of first portion 423 length from point "A" to point "B" and from point "E" to point "F." Unlike a conventional single-circle channel, channel 420 has second portion 425 and third portions 427 that can more desirably remove the heat and cool down a thermally processed substrate. It is noted that the configuration of second portion 425 and third portions 427 are merely examples. The routing of second portion 425 and/or third portions 427 can be modified as long as the cooling time of the substrate can be desirably achieved. For example, a conventional single-circle channel can have a length of about 39.6 inches. Channel 420 can have a length of about 55.2 inches. Channel 420 is longer than a conventional circle channel by about 35%. The increasing length of channel 420 carries more cooling water to cool down the substrate and thus cool down the substrate at a faster rate.

In embodiments, cooling plate 210a can have a thickness of about 0.75 inch. Compared with a conventional cooling plate having a 1-inch thickness, cooling plate 210a is thinner by 0.25 inch and has a small volume. For example, the volume of cooling plate 210a can be about 51.4 in$^3$ whereas a conventional cooling plate has a volume of 133.9 in$^3$. The thermal mass of cooling plate 210a can be less than a conventional cooling plate by about 62%. Since carrying less thermal mass, cooling plate 210a can desirably release the heat of a thermally processed substrate as discussed with reference to FIG. 6.

Figure 6:
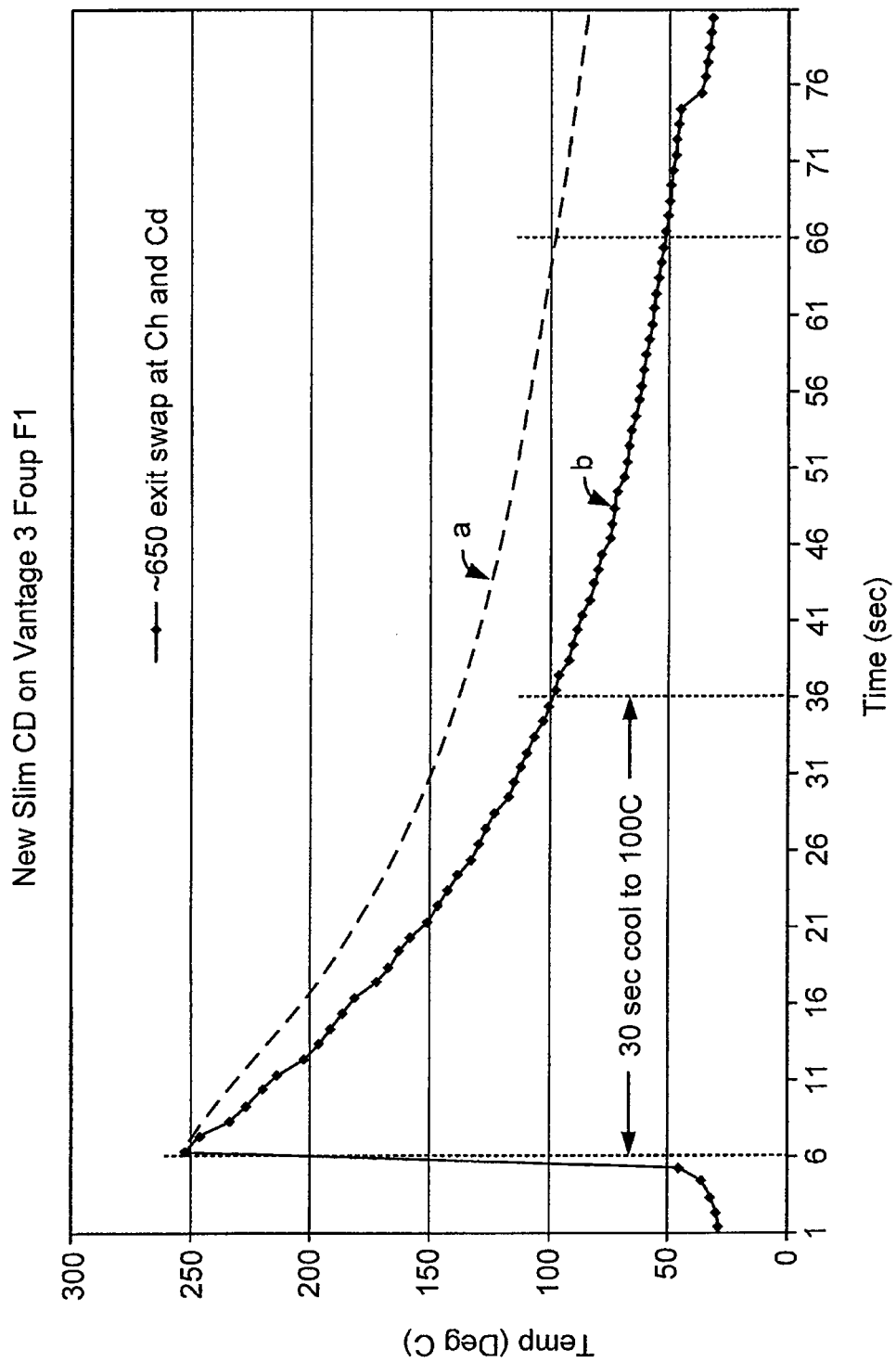
FIG. 6 is a plot of temperature vs. time comparing a cool-down profile of substrates using a conventional cooling plate with a cool-down profile of substrates using the cooling plate of FIGS. 3-5, according to one embodiment of the invention.

FIG. 6 is a graph comparing the cooling-down profiles of substrates when cooled using a conventional cooling plate and a cooling plate according to an embodiment of the invention. After a rapid thermal process, the processed substrate is removed from processing chamber 102 (shown in FIG. 1) and then loaded on cooling plate 210a (shown in FIG. 2A), for example. A thermocouple is disposed at the center of cooling plate 210a to measure the temperature of the substrate. In FIG. 6, the spike indicates that the read temperature from the thermocouple is about 250° C. Cooling plate 210a cools down the substrate temperature after it has been processed in the RTP to about 100° C. in about 30 seconds (as shown by curve "b"), as measured by the thermocouple disposed at the center of cooling plate 210a. Compared with a conventional cooling plate that takes about 60 seconds to cool down the substrate to about 100° C. (as shown by curve "a"), cooling plate 210 is much more efficient for cooling substrates then conventional cooling plates. Accordingly, thermal processing apparatus 100 (shown in FIG. 1) desirably process more substrates when the cooling plate of the present invention is used to cool the substrates.

In one embodiment of the invention a cooling plate includes a channel to transmit a fluid, wherein the channel is disposed within a base and the channel has a first portion and a second portion. The first portion is disposed substantially along a peripheral edge of the base, and the second portion is coupled to the first portion and is disposed further away from the peripheral edge of the base than the first portion. The second portion has a length that is at least about 35% as long as the length of the first portion. The cooling plate also includes a lid disposed over the base and the channel; wherein the lid provides support for a substrate. In one embodiment, the base and the lid have a thickness of about 0.75 inches together when combined.

In another embodiment of the invention, the peripheral edge is a circumferential edge.

In yet another embodiment of the invention, the second portion has a circular shape disposed substantially around a center of the cooling plate.

In yet another embodiment of the invention, the cooling plate further includes a plurality of balls to support the substrate and separate the substrate away from a surface of the cooling plate, wherein the plurality of balls are coupled to the lid. In some embodiments the plurality of balls are attached to the lid. The plurality of balls can range in number from between about ten to about twenty. In other embodiments, the plurality of balls are positioned so as to form two circular patterns around a center of the lid. In yet other embodiments, at least some of the plurality of balls are ceramic balls.

In yet another embodiment of the invention, the base has an opening disposed around a center of the cooling plate. In some embodiments an edge of the opening is substantially along an edge of the second portion of the channel.

In another embodiment of the invention, a thermal processing apparatus includes at least one thermal processing chamber constructed to thermally process a substrate and an interface unit connected with the at least one thermal processing chamber, wherein the interface unit includes at least one cooling plate. The cooling plate includes a channel to transmit a fluid, wherein the channel is disposed within a base and the channel has a first portion and a second portion. The first portion is disposed substantially along a peripheral edge of the base, and the second portion is coupled to the first portion and is disposed further away from the peripheral edge of the base than the first portion. The second portion has a length that is at least about 35% as long as the length of the first portion. The cooling plate also includes a lid disposed over the base and the channel; wherein the lid provides support for a substrate.

In yet another embodiment of the invention, the thermal processing apparatus further includes at least one load port capable of supporting a substrate carrier. In one embodiment, there are three load ports and two cooling plates. One of the cooling plates can be adjacent to a left load port and the other one of the cooling plates can be adjacent to a right load port. In another embodiment, the cooling plate has a thickness of about 0.75 inches and is positioned over the load port.

In yet another embodiment of the invention, the thermal processing apparatus includes two cooling plates located on a plane that is substantially level with the ground (i.e. parallel to the ground).

In yet another embodiment of the invention, the second portion of the channel of the cooling plate of the thermal processing apparatus has a circular shape substantially around a center of the cooling plate.

In yet another embodiment of the invention, the cooling plate of the thermal processing apparatus further includes a plurality of balls to support the substrate and separate the substrate away from a surface of the cooling plate, wherein the plurality of balls are coupled to the lid. In some embodiments the plurality of balls are attached to the lid. The number of balls can range from between about ten to about twenty. The plurality of balls can be positioned so as to form two circular patterns around a center of the lid. In some embodiments, the plurality of balls are ceramic.

In yet another embodiment of the invention, the base of the cooling plate of the thermal processing apparatus has an opening around a center of the cooling plate. In some embodiments, an edge of the opening can be substantially along an edge of the second portion of the channel.

In yet another embodiment of the invention, the thermal processing apparatus further includes a manifold coupled to the channel for delivering a cooling fluid, wherein the manifold is located to the side of a path travelled by a robot used to load and unload substrates.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise", "comprising", "include", "including", and "includes" when used in this specification and in the following claims are intended to specify the presence of stated features, integers, components, or steps, but they do not preclude the presence or addition of one or more other features, integers, components, steps, acts, or groups.

What is claimed is:

1. A cooling plate of a thermal processing apparatus comprising:
    a base having an opening surrounding a center of the base, the opening having a central portion around the center and an elongated portion protruding outward from the central portion, the central portion bounded by a circumferential edge and the elongated portion bounded by substantially parallel sides and an end extending between the sides;
    a channel disposed within the base to transmit a fluid through the base, the channel having first portions each disposed substantially along a peripheral edge of the base, a second portion disposed substantially along the circumferential edge of the central portion of the opening, and third portions each disposed along the sides of the elongated portion of the opening, each of the third portions connecting one of the first portions to the second portion, the second portion having a length that is at least about 35% as long as a combined length of the first portions, wherein the circumferential edge of the central portion of the opening is substantially along an edge of the second portion of the channel, and an edge of each of the sides of the elongated portion of the opening is substantially along an edge of one of the third portions of the channel; and
    a lid disposed over the base, the opening, and the channel, wherein the lid provides support for a substrate.

2. The cooling plate of claim 1 wherein the base and the lid have a thickness of about 0.75 inches together when combined.

3. The cooling plate of claim 1 wherein the peripheral edge of the base is a circumferential edge of the base.

4. The cooling plate of claim 1 wherein the second portion has a circular shape disposed substantially around a center of the cooling plate.

5. The cooling plate of claim 1 further comprising a plurality of balls to support the substrate and separate the substrate away from a surface of the cooling plate, wherein the plurality of balls are coupled to the lid.

6. The cooling plate of claim 5 wherein the plurality of balls are attached to the lid.

7. The cooling plate of claim 5 wherein the plurality of balls ranges in number from between about ten to about twenty.

8. The cooling plate of claim 5 wherein the plurality of balls are positioned so as to form two circular patterns around a center of the lid.

9. The cooling plate of claim 5 wherein at least some of the plurality of balls are ceramic balls.

10. The cooling plate of claim 1 wherein the central portion has a substantially circular shape.

11. A thermal processing apparatus comprising:
    at least one thermal processing chamber to thermally process a substrate; and
    an interface unit connected with the at least one thermal processing chamber, wherein the interface unit includes at least one cooling plate comprising:
        a base having an opening surrounding a center of the base, the opening having a central portion around the center and an elongated portion protruding outward from the central portion, the central portion bounded by a circumferential edge and the elongated portion bounded by substantially parallel sides and an end extending between the sides;

a channel disposed within the base to transmit a fluid through the base, the channel having first portions each disposed substantially along a peripheral edge of the base, a second portion disposed substantially along the circumferential edge of the central portion of the opening, and third portions each disposed along the sides of the elongated portion of the opening, each of the third portions connecting one of the first portions to the second portion, the second portion having a length that is at least about 35% as long as a combined length of the first portions, wherein the circumferential edge of the central portion of the opening is substantially along an edge of the second portion of the channel, and an edge of each of the sides of the elongated portion of the opening is substantially along an edge of one of the third portions of the channel; and a lid disposed over the base, the opening, and the channel, wherein the lid provides support for a substrate.

12. The thermal processing apparatus of claim 11 further comprising at least one load port capable of supporting a substrate carrier.

13. The thermal processing apparatus of claim 12 wherein there are three load ports and two cooling plates.

14. The thermal processing apparatus of claim 13 wherein one of the cooling plates is disposed adjacent to a left load port and the other one of the cooling plates is disposed adjacent to a right load port.

15. The thermal processing apparatus of claim 12 wherein the cooling plate has a thickness of about 0.75 inches and is disposed over the load port.

16. The thermal processing apparatus of claim 11 wherein there are two cooling plates located on a plane that is substantially level with the ground.

17. The thermal processing apparatus of claim 11 wherein the second portion of the channel has a circular shape substantially around a center of the cooling plate.

18. The thermal processing apparatus of claim 11 further comprising a plurality of balls to support the substrate and separate the substrate away from a surface of the cooling plate, wherein the plurality of balls are coupled to the lid.

19. The thermal processing apparatus of claim 18 wherein the plurality of balls are attached to the lid.

20. The thermal processing apparatus of claim 18 wherein there are between about ten and about twenty balls.

21. The thermal processing apparatus of claim 18 wherein the plurality of balls are positioned so as to form two circular patterns around a center of the lid.

22. The thermal processing apparatus of claim 18 wherein the plurality of balls are ceramic balls.

23. The thermal processing apparatus of claim 11 further comprising a manifold coupled to the channel for delivering a cooling fluid, wherein the manifold is located to the side of a path traveled by a robot used to load and unload substrates.

24. The thermal processing apparatus of claim 11 wherein the central portion has a substantially circular shape.

* * * * *